United States Patent [19]
Currie et al.

[11] Patent Number: 5,530,287
[45] Date of Patent: Jun. 25, 1996

[54] HIGH DENSITY WIRE BOND PATTERN FOR INTEGRATD CIRCUIT PACKAGE

[75] Inventors: Thomas P. Currie, St. Paul; James H. Rogneby, Bloomington, both of Minn.

[73] Assignee: Unisys Corporation, Blue Bell, Pa.

[21] Appl. No.: 306,086

[22] Filed: Sep. 14, 1994

[51] Int. Cl.⁶ .............................. H01L 23/48; H01L 23/52
[52] U.S. Cl. ...................... 257/692; 257/700; 257/697
[58] Field of Search ...................................... 257/691, 698, 257/692, 693, 690, 700, 776, 773, 774, 697

[56] References Cited

U.S. PATENT DOCUMENTS 5,117,275   5/1992   Bregman et al. ........................ 257/776
5,235,211   8/1993   Hamburgen .............................. 257/700

Primary Examiner—Sara W. Crane
Assistant Examiner—S. V. Clark
Attorney, Agent, or Firm—Charles A. Johnson; Mark T. Starr

[57] ABSTRACT

An improved integrated circuit package having high density interconnections between die pads and a plurality of coplanar connector tabs on a selected metal layer in the integrated circuit package, wherein the pitch of the connector tabs is a predetermined multiple of the pitch of the die pads.

17 Claims, 6 Drawing Sheets

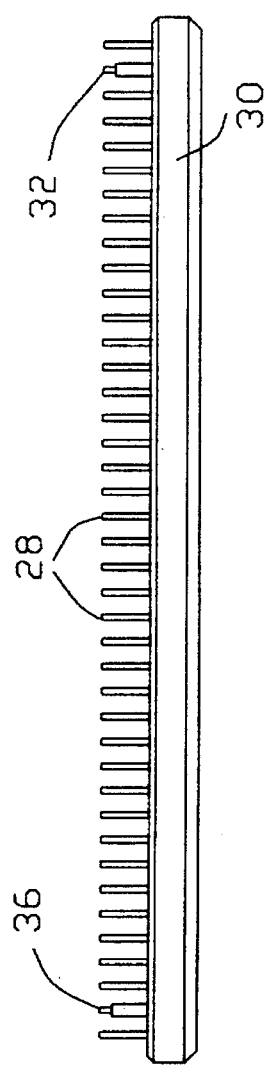
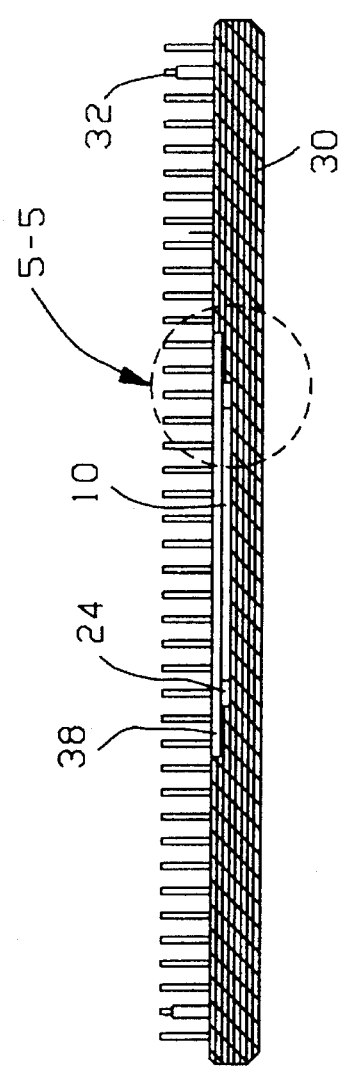
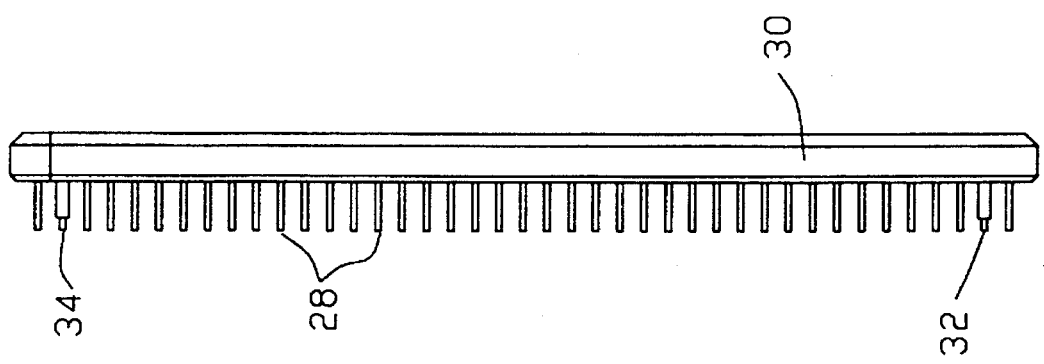

HIGH DENSITY WIRE BOND PATTERN FOR INTEGRATD CIRCUIT PACKAGE

BACKGROUND OF THE INVENTION

1. Field of the Invention

This invention relates generally to the packaging of electronic components. More particularly, it relates to a high density circuit package for bonding integrated circuit die pads to associated contact pins. Still more particularly, the invention relates a high density planar array of connector tabs allowing reliable interconnection to associated die tabs.

2. Background of the Invention

The advent of development of integrated circuity has given rise to the need for integrated circuit packages that will both house and protect the integrated circuit die, and will provide a mechanism of making electrical interconnection between the circuits on the integrated circuit die and the contact pins that are utilized to make electrical interconnections to circuits, power, and ground external to the integrated circuit die. In the early stages of development of integrated circuits there were relatively few connections between the integrated circuit die and the external circuitry. For those early types of integrated circuits, the interconnection to the integrated circuit package was relatively straight forward and generally involved an array of connector tabs arranged around a die cavity and adapted to be electrically connected to associated die pads.

In the early integrated circuit development there were relatively few circuit on each integrated circuit die, and the circuit operational rates were by modern day standards relatively slow. Accordingly, the spacing and configuration of the connector tabs with respect to the die pads was relatively less important in the consideration of the length of interconnection conductors and the degree of difficulty of reliable assembly. The number of connector tabs to be located around the die cavity characteristically numbered in the range of twenty to fifty.

As the integrated circuit technology advanced, more circuit cells were able to be fabricated in a similar die area so that substantially increased functionality could be accomplished on a given integrated circuit die. The added functionality and increase in the number of circuits involved generally required a larger number of pins out to the associated external circuitry. As physical sizes decreased and the number of required die pads increased, it was necessary in the prior art to develop integrated circuit packages that would accommodate connections to a larger number of connector tabs. Both integrated circuit users and integrated package manufacturers worked to develop die interconnect systems that would accommodate the higher die pad densities. One approach in the prior art to handling increased densities was to develop a multilayer package that would array groups of connector tabs on separate layers resulting in essentially a step configuration around the die cavity. This necessitated registration of the layers during manufacturing such that the pitch of the connector tabs on the various layers were maintained and that the relationship between layers was maintained so that the connecting wires would remain properly aligned and not result in unwanted short circuits in manufacturing. So long as the pitch of the die pads remained greater than the ability to hold tolerances during manufacture of the integrated circuit package, this approach to providing step connector tabs was workable.

In the first phases of step connector tab development, packages were developed that had connector tabs arrayed on two layers of the integrated circuit connector. Then as the number die pads increased, it was found to be advantageous to deploy the connector tabs on three layers of the integrated circuit connector.

The increase in the amount of circuity incorporated on each die and the increase in the circuit switching rate has resulted in the relatively short interconnection lead through the connector to ground, power and other signal interconnections to be treated as transmission line designs. The step approach to providing die pad to connector tab connection became relatively more difficult to handle, both from the standpoint of fabrication and from the standpoint of differences in conductor lengths affected the circuit operation. Further, the increased number of interconnection conductors and the reduced sizes of the die pads and the connector tabs rendered automated assembly more difficult due to the alignment tolerances between layers of the integrated circuit package.

Integrated circuit packages utilizing the stepped array of connector tabs have been found to be effective up to approximately 400 interconnections of die pads to connector tabs and at the circuit operational rates for die having those numbers of die pads. Beyond these levels manufacturing tolerances cannot be reliably held.

At the present time the state of integrated circuitry has advanced such that more than 500 die pads are arrayed on the integrated circuit die and must be connected to the associated connector tabs. For the physical size of modern day die, the spacing of die pads can be less than 4 mils. Since the registration of multilayers in the integrated circuit die package has a tolerance approaching plus or minus 4 mils, it can be seen that a simple tolerance build up between layers can result in misalignment of connector tabs with respect to the layers that is approximately equal to the spacing of the die pads. This concern makes it relatively impossible to provide an automated bonding process for interconnecting the die pads to their associated connector tabs. Additionally, circuit rates are such that it is essential that the circuit paths to ground and voltage and signal pins be minimized to accommodate circuit operational requirements. It has been determined that the stepped array of connector tabs is not workable for these of levels of circuit operation and die pad densities.

OBJECTS

It is a primary objective of this invention to provide an improved high density integrated circuit package that will accommodate a high density of integrated circuit die pad interconnect.

Yet another object of this invention is to provide a coplanar array of connector tabs for interconnection to associated die pads.

A further objective of this invention is to provide an improved high density integrated circuit package having groups of coplanar rows of connector tabs arranged in close proximity to a die cavity.

Still another objective of this invention is to provide an improved coplanar array of connector tabs that are arranged to provide noninterferring paths of interconnection to associated die pads.

A further objective of this invention is to provide a predetermined array connector tabs arranged in staggered rows were the pitch of the connector tabs in each of the rows is a multiple of the pitch of the die pads.

Another objective of the invention is to provide an improved high density integrated circuit package that allows automated wire bonding of the die pads to associated connector tabs.

Another objective of the invention is to provide an improved coplanar array of connector tabs that minimize circuit interconnect lengths to ground.

Other more detailed and specific objectives of the invention will become apparent from a consideration of the Summary of the Invention and from a consideration of the Drawings as described in the detailed description.

SUMMARY OF THE INVENTION

According to the present invention, the foregoing and other objectives and advantages are attained by a structure for use in a multilayer integrated circuit package having die cavity for mounting an integrated circuit die having a plurality of die pads arranged in a predetermined pattern at a predetermined pitch on the surface of the integrated circuit die, wherein the package includes a predetermined number of metal layers separated by a dielectric material, wherein a high density die pad to package interconnect system includes a plurality of coplanar connector tabs on a selected one of the metal layers. The connector tabs are arranged in a number of rows having predetermined relationship to the die pads. Groups of the connector tabs are arranged in rows having a pitch that is a multiple of the predetermined pitch of the die pads.

The present invention relates to a high density integrated circuit package arranged for use in mounting and electrically connecting an integrated circuit die having an array of closely arranged die pads, the package including a number of metal layers wherein each of the metal layers are developed in predetermined metal patterns, with dielectric layers stacked and interleaved between pairs of the metal layers, wherein the entire structure is constructed of co-fired ceramic. The integrated circuit package body that results includes a die cavity arranged for mounting an associated integrated circuit die with the die cavity positioned in a fixed relationship to a selected one of the metal layers, Where the selected one the metal layers includes a plurality of coplanar connector tabs arranged in offset rows around and in cooperation with the die cavity. The array of coplanar connector tabs are arranged such that the offset rows have a pitch that is a multiple of the pitch of the die pads.

The invention provides an improved high density integrated circuit package that avoids misalignment resulting from stack arrangements of connector tabs and provides an improved mechanism for minimizing the electrical conductor length from selected die pads to ground potential or to applied voltages.

Still other objects and advantages of the present invention will become readily apparent to those skilled in the art from consideration of the entire Specification and Drawings and in particular by the Detailed Description of the Preferred Embodiment. It is of course readily apparent that the invention is capable of other and different embodiment, and its details are capable of modification in various implementation aspects, all without departing from spirit and scope of the invention. Accordingly, the Drawings and Description of the Preferred of the Embodiment are to be considered as illustrative in nature, and not as restrictive.

BRIEF DESCRIPTION OF THE DRAWINGS

In the Detailed Description of the Preferred Embodiment, there will be reference to the Drawings describing the invention, in which:

FIG. 2 is a side view of the high density integrated circuit package illustrated in FIG. 1;

FIG. 3 is an end view of the integrated circuit package illustrated in FIG. 1;

FIG. 4 is a sectioned view taken along center-line 4—4 in FIG. 1, and illustrates the multilayered configuration of the high density integrated circuit package of the invention;

DESCRIPTION OF THE PREFERRED EMBODIMENT

Figure 1:
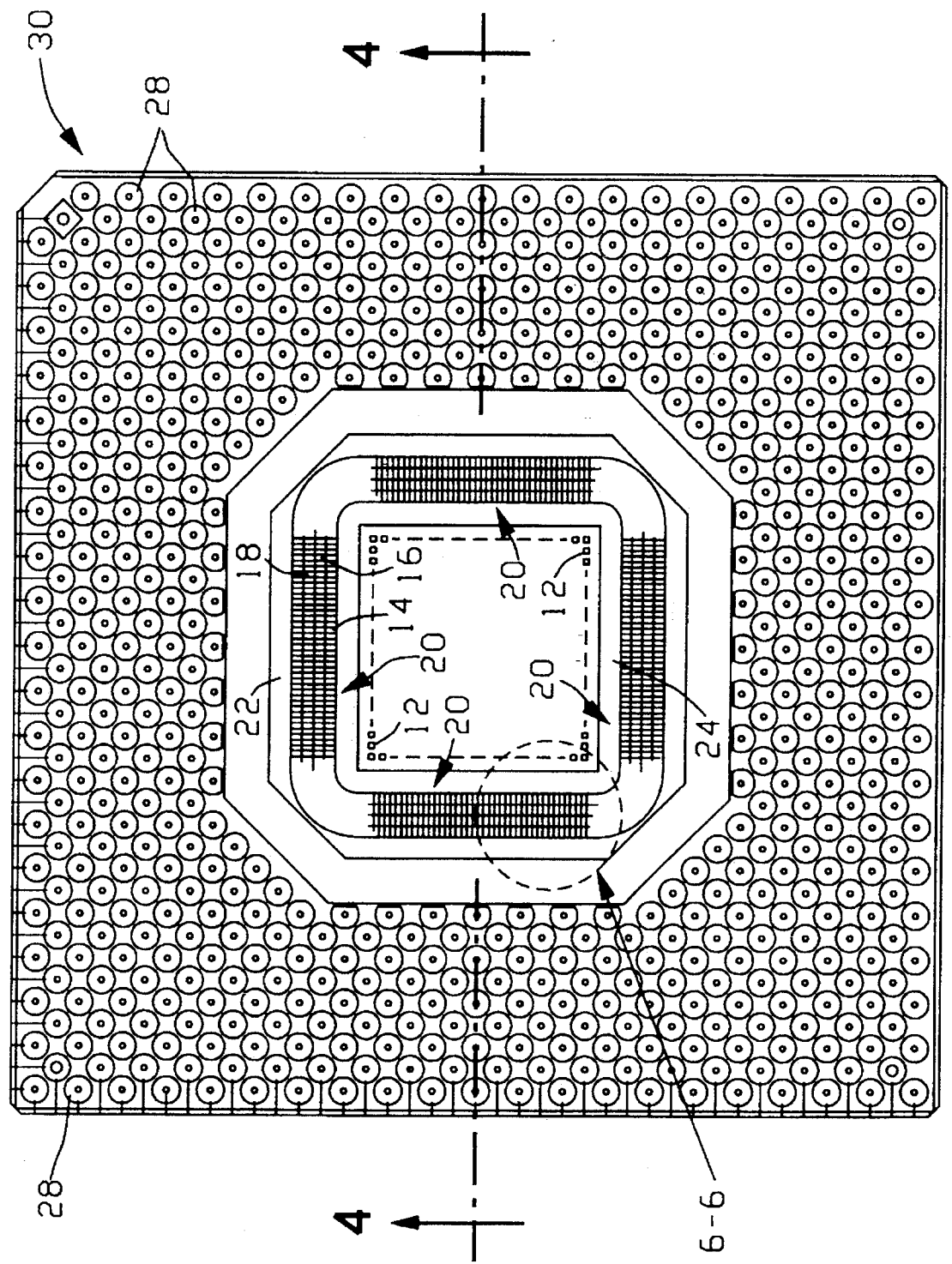
FIG. 1 is a plan view of the high density integrated circuit package with an integrated circuit die in place and illustrates the configuration of the invention.

FIG. 1 is a plan view of the high density integrated circuit package with an integrated circuit die in place and illustrates the configuration of the invention. An integrated circuit die 10 has a plurality of die pads 12 extending around the periphery. In the preferred embodiment, the number of die pads 12 is 591. It is of course understood that the concept of this invention allow die pad densities that are greater than the prior art stepped configuration. For the preferred embodiment, the center-to-center spacing of adjacent die pads 12 is about 4 mils, it being understood that this center-to-center spacing, otherwise referred to as pitch, can be greater than or less than the nominal 4 mil dimension. The die 10 is illustrated without electrical interconnection to the connector tabs. The connector tabs are illustrated in offset rows 14, 16, and 18 along all four sides of die 10. The specifics of the configuration of the rows 14, 16 and 18 of the plurality of connector tabs reference collectively by arrows 20 will be described in more detail below. It is sufficient to understand at this point that the plurality of connector tabs are coplanar and are deposited on layer 22.

The die cavity 24 is sufficiently large to allow spacing between the edges of the die 10 and the first row 14 of connector tabs 20. A cover seal surface 26 is arranged around the connector tabs and is adapted to receive a cover that will seal the die cavity 24 and the rows 14, 16 and 18 of connector tabs 20. The cover is not shown.

Surrounding the die cavity 24 and the interconnect circuitry, are a plurality of pins 28 that are arranged in a predetermined pin grid array and are adapted to provide electrical interconnection from external ground, power sources and signal sources through the die body shown as arrow 30 to make selected connections through body 30 to the circuits on the die 10.

FIG. 2 is a side view of the high density integrated circuit package illustrated in FIG. 1. In addition to illustrating the array of pins 28, there are also shown standoffs 32 and 34 which are used in the assembly of body 30 to an associated circuit board (not shown).

FIG. 3 is an end view of the integrated circuit package illustrated in FIG. 1. This view illustrates standoff pins 32 and 36 utilized for positioning body 30, as well as the array pins 28.

FIG. 4 is a sectioned view taken along center-line 4—4 in FIG. 1, and illustrates the multilayered configuration of the high density integrated circuit package of the invention. This view illustrates the multilayers of body 30 which will be described in more detail below, and shows die 10 located within die cavity 24 and in cooperative relationship to the connector tab layer 38 (referenced as surface 22 in FIG. 1).

Figure 5:
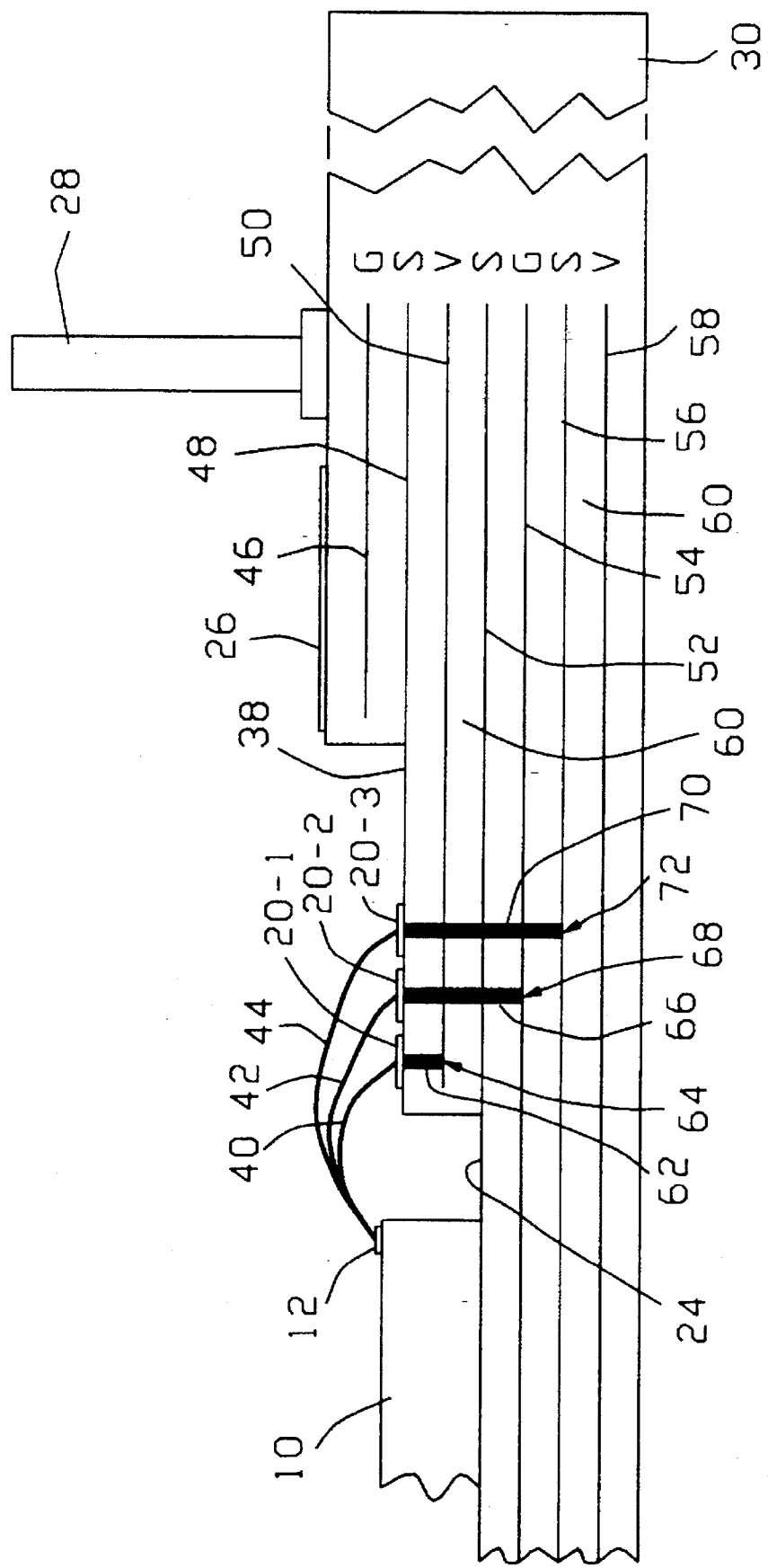
FIG. 5 is a partial cutaway section view taken at 5—5 in FIG. 4, and is an expanded view that illustrates coplanar connector tabs in conjunction with an associated die.

FIG. 5 is a partial cutaway section view taken at 5—5 in FIG. 4, and is an expanded view that illustrates coplanar connector tabs in conjunction with an associated die. In this partial view die 10 is shown having three die tabs 12 coupled by wires 40, 42, and 44 to connector tabs 20-1, 20-2, and 20-3, respectively.

The body 30 is comprised of a plurality of metal layers, in this configuration including a ground layer G labeled 46, a signal layer S labeled 48, a voltage level V labeled 50, a second signal layer S labeled 52, a second ground layer G labeled 54, a third signal layer S labeled 56, and a second voltage layer V labeled 58. Each of the metal layers are separated by dielectric layers collectively identified and labeled 60.

In the configuration illustrated, conductor tab 20-1 is coupled by via conductor 62 to make electrical contact with signal layer 48 at contact point 64. In a similar fashion, connector tab 20-2 is electrically connected through via conductor 66 to ground 54 at contact point 68. Conductor tab 20-3 is electrically connected through via conductor 70 to signal line 56 at connection point 72. It can been seen that all of the connector tabs 20-1, 20-2, and 20-3 are coplanar and located on a predetermined layer 38.

Figure 6:
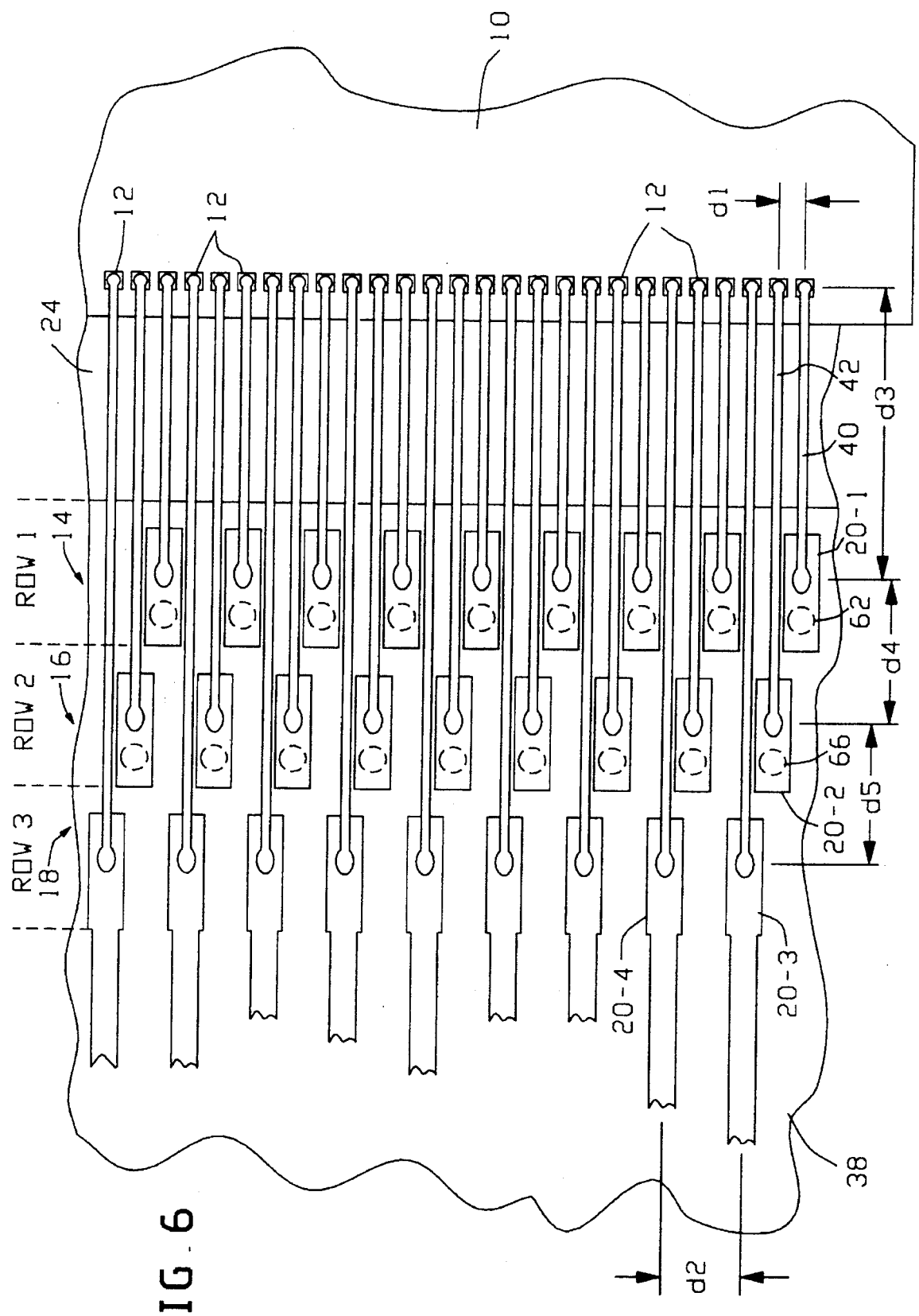
FIG. 6 is an expanded view taken at 6—6 in FIG. 1 and illustrates a number of connector tabs arranged in rows for cooperation with associated die pads.

FIG. 6 is an expanded view taken at 6—6 in FIG. 1 and illustrates a number of connector tabs arranged in rows for cooperation with associated die pads. In this sectional view, there is shown a plurality of die pads 12 at the periphery of die 10 with the die placed in die cavity 24. The die pads 12 have a center-to-center (pitch) spacing of d1, which for the preferred embodiment is approximately 4 mils.

Layer 38 has row one shown by arrow 14, row 2 shown by arrow 16, and row three shown by arrow 18 of connector tabs 20 located thereon. Relating the structure back to FIG. 5, wire 40 is illustrated bonded to die pad 12 at one end, and at the other end to connector tab 20-1, along with its hidden via connector 62. Wire 42 is coupled to die 10 at one end and to connector tab 20-2 at its other end with its hidden via conductor 56. Finally, wire 44 is connected at one end to die pad 12 and at its other end to connector tab 20-3. The via connector 70 is not shown in this cut-away view.

The center-to-center spacing of adjacent connector tabs 20-3 and 20-4 is shown as dimension d2, and for the three row configuration is a pitch of essentially three times the d1 pitch. The center-to-center spacing of the connector tab 20 in each of the rows is essentially fixed and not subject to tolerance shift separately in the fabrication process. This allows the location of the associated wire bond wires to be essentially parallel and provide that the lengths to the respective rows to be closely established. The length of bond wire 40 is d3, the length of bond wire 42 is the sum of the length d3 plus its spacing length d4, and the length of bond wire 44 is the length of d3 plus d4 plus d5. The bond wires are attached a wire bond process well known in the art.

The staggered spacing connector tabs 20 allows the connector tabs to have a wider dimension than would otherwise be required, and provide a reliable tab area as a target for the wire bond process to thereby assure reliable interconnection.

Having described the preferred embodiment of the invention, it's advantages can readily be understood from a consideration of prior art configurations.

Figure 7:
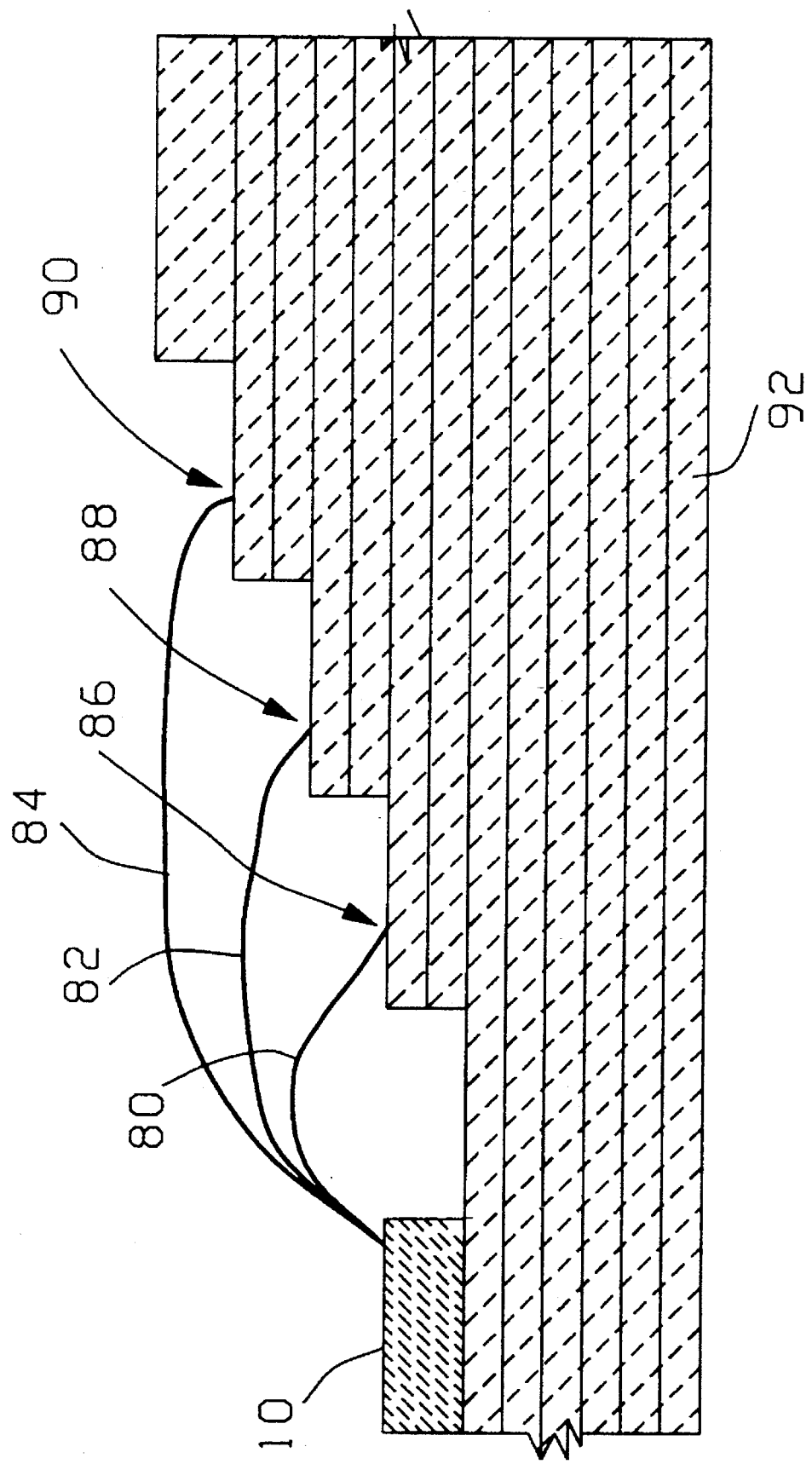
FIG. 7 is a diagrammatic illustration of a multilayer integrated circuit package having connector tabs arranged on three step layers, of the type utilized in the prior art.

FIG. 7 is a diagrammatic illustration of a multilayer integrated circuit package having connector tabs arranged on three layers, of the type utilized in the prior art. In the prior art configuration it can be seen that die 10 would have its die pads coupled through bond wires 80, 82, and 84 to tabs on stepped layers 86, 88, and 90, respectively. Again it can be seen that the body structure 92 is comprised of a plurality of layers that are fabricated to form an integrated body when completed.

Figure 8:
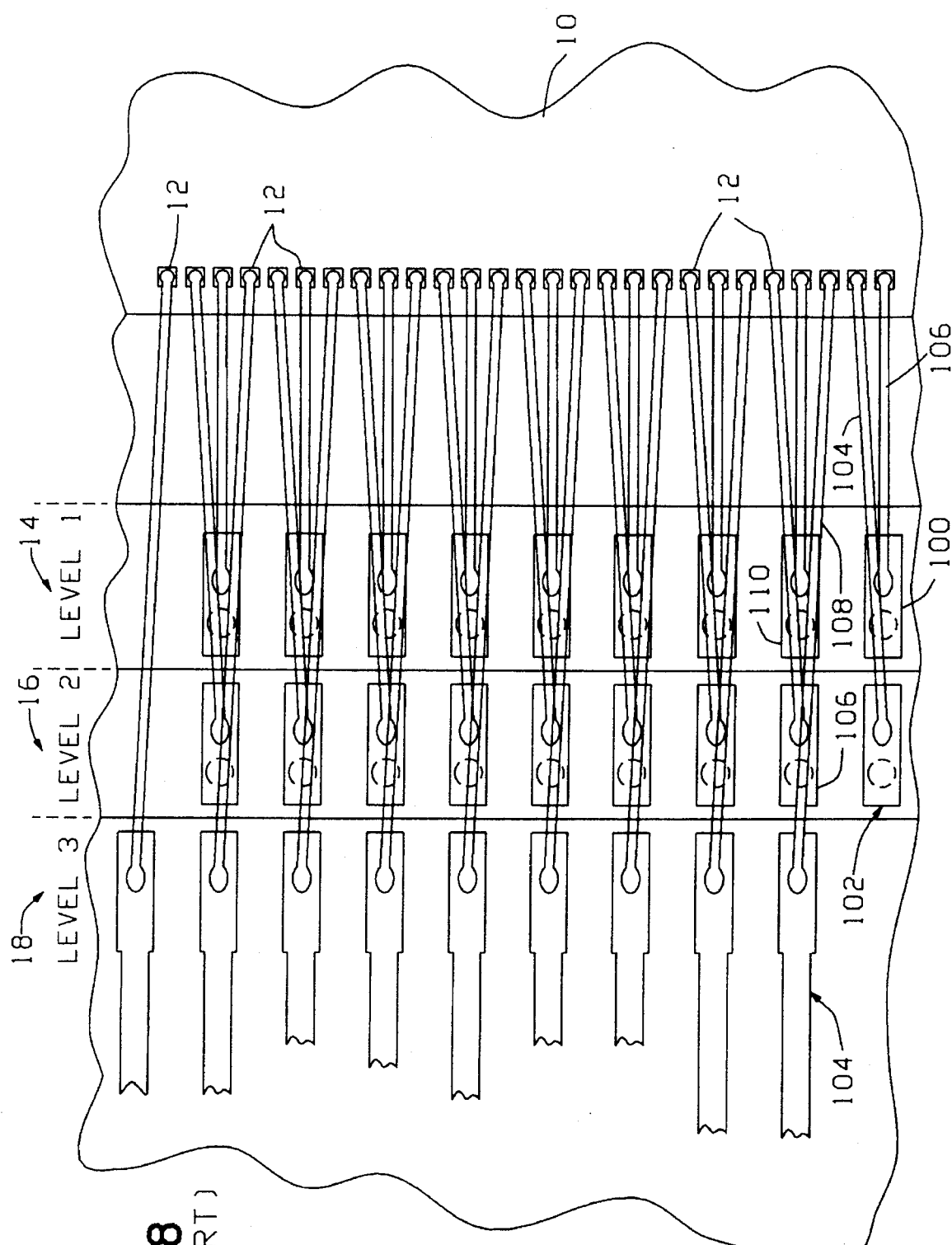
FIG. 8 is a sectioned plan view of the prior art configuration of FIG. 7 illustrating tolerance build up that renders the configuration unacceptable.

FIG. 8 is a sectioned plan view of the prior art configuration of FIG. 7 illustrating tolerance build up that renders the configuration unacceptable. This configuration is shown to illustrate the problem that would result in attempt to wire bond die pads 12 having a pitch of approximately 4 mil to a three level stepped array of connector tabs where there has been typical misalignment occurring in the fabrication of the shelf structure. In this configuration, using connector tab 100 has a reference, it can be seen that a 4 mil shift of level 2, labeled 88, with respect to level 1 labeled 86, will result in level 2 connector tab 102 being directly in line with connector tab 100. Assuming the appropriate layout of all connector tab in level 2 to be on a uniform center-to-center dimension, all of the connector tabs in level 2 will be improperly aligned with the connector tabs in level 1.

The problem of misalignment results in the wire bond wire 104 passing over wire bond wire 106 and its associated connector tab 100. This overlap creates a problem of manufacture in having the wire bond machine appropriately hit connector tab 102, and results in a potential problem of short circuit between bond wire 104 and 106.

If a worst-case is assumed for level 3, labeled 90, with a 4 mil shift in the opposite direction with respect to level 1, it can be seen that connector tab 104 will not be offset, and will line up directly with connector tab 106 in level 2. Again, this tolerance misalignment will involve all of the connector tabs in level 3 in a similar fashion. The result is that bond wire 108 will pass over level 1 connector tab 110, and over connector tab 106 in order to make interconnection with the level 3 connector tab 104. With the complexity of the circuitry involved, these misalignments which are inherent in the layered manufacturing process are not acceptable, and the problem is solved through the coplanar offset rows of connector tabs provided by the subject invention.

It has also been determined that the interconnections where connector tab misalignment occurs renders the wire bond process substantially more intricate in that axial adjustment between the ends must be accomplished in order to hit the appropriate connector pad area.

While the preferred embodiment has been illustrated to utilize three offset rows of coplanar connector tabs, it should be understood that a similar advantage would be achieved if the number of die pads were of a larger pitch and only two rows of connector tabs would be required. Further, it should be understood that if the number of die pads increased, an additional one or more rows of offset coplanar connector tabs could be utilized.

As indicated above, various modifications and adjustments of the structure will become apparent to those skilled in the art and what has been described is a presently contemplated best mode, and that any such modifications can be accomplished without further inventive activity. Accordingly, what is intended to be protected by Letters Patent is set forth in the appended claims.

We claim:

1. For use in mounting and electrically connecting an integrated circuit die having an array of closely arranged die pads utilized for making wire bond electrical connection to circuits on the die, a high density integrated circuit package comprising;

a plurality of metal layers each having a predetermined metal pattern;

a plurality of dielectric layers stacked with each of said plurality of dielectrical layers interleaved between adjacent pairs of said plurality of metal layers and joined as a package body;

a die cavity in said body, said die cavity arranged for receiving the integrated circuit die and positioning it in a predetermined relationship to a predetermined one of said plurality of metal layers;

a plurality of external connector pins mounted on said body in a predetermined array;

a plurality of via electrical connections coupling selected ones of said plurality of metal layers; through ones of said plurality of the dielectric layers to associated ones of said plurality of external connector pins: and a plurality of coplanar connector tabs arranged as a part of said predetermined one of said plurality of metal layers and arranged in n offset rows at predetermined locations around said die cavity, where n is an integer with a value of at least 2, and electrically coupled to predetermined other ones of said plurality of metal layers, whereby individual connection wires may be directly bonded to each of said connector tabs and to associated ones of the die pads.

2. A high density integrated circuit package as in claim 1, wherein n is 2; a first set of alternative ones of said connector tabs are arranged as one of said n offset rows and arranged for each to be coupled with associated ones of a first set of alternative ones of the die pads; and a second set of alternate ones of said connector tabs are arranged as a second set of said n offset rows and arranged to be coupled with associated ones of a second set of alternate ones of the die pads.

3. A high density integrated circuit package as in claim 1, wherein n is three;

a first set of said connector tabs in a first of said n offset rows is arranged to be coupled to associated ones of a first set of the die pads;

a second set of said connector tabs in a second of said n offset rows is arranged to be coupled to associated ones of a second set of the die pads; and a third set of said connector tabs in a third of said n offset rows is arranged to be coupled to associated ones of a third set of the die pads.

4. A high density integrated circuit package as in claim 3, with the closely arranged die pads arranged with a predetermined pitch, wherein the pitch of each of said first set, said second set, and said third set of said connector tabs is at least three times the predetermined pitch.

5. A high density integrated circuit package as in claim 1 and further including a seal ring around the die cavity, whereby a cover can be affixed thereto for sealing said die cavity.

6. A high density integrated circuit package as in claim 4 wherein said package body is comprised of co-fired ceramic.

7. A high density integrated circuit package as in claim 3 wherein at least one of said plurality of metal layers is a ground plane;

said first set of connector tabs is arranged adjacent said die cavity; and at least selected ones of said first set of connector tabs are electrically coupled to said ground plane;

whereby the circuit path length to ground is minimized.

8. For use in a multilayer integrated circuit package having a die cavity for mounting an integrated circuit die having a plurality of die pads arranged in a predetermined pattern at a predetermined pitch on the surface of the integrated circuit die, the package including a predetermined number of metal layers separated by dielectric material, a high density die pad to package wire bond interconnect system comprising:

a plurality of coplanar connector tabs on a selected one of the metal layers and arranged in a number of rows in a predetermined relationship to the die pads;

via electrical connections coupling selected ones of said coplanar connector tabs through ones of the layers of dielectric material to a predetermined associated one of the metal layers;

ones of said plurality of connector tabs in each of said rows arranged at a pitch that is a multiple of the predetermined pitch of the die pads, said multiple determined by said number of rows;

and an array of connector terminals coupled to selected associated ones of said metal layers.

9. An interconnect system as in claim 8 wherein said plurality of connector tabs is arranged uniformly around the die cavity and immediately adjacent thereto.

10. An interconnect system as in claim 9, and further including a wire bond coupled intermediate each of said plurality of connector tabs and associated one of the plurality of die pads.

11. An interconnect system as in claim 9 wherein selected ones of said plurality of connector tabs in each of said rows are offset from the ones of said plurality of connector tabs in each other ones of said rows.

12. An interconnect system as in claim 10 wherein one of said wire bonds are arranged in predetermined groups and within said groups are substantially parallel.

13. With the predetermined pitch of the die pads being 4 mils, or less, the interconnect system as in claim 11, wherein said number of rows is three and said pitch of said connector tabs in each of said rows is approximately 12 mils or less.

14. A high density integrated circuit package comprising;

an integrated circuit die having a plurality of die pads arranged at a predetermined die pad pitch in a predetermined pattern for making electrical interconnection to said integrated circuit die;

a plurality of metal layers, each having a predetermined metal pattern;

a plurality of dielectric layers, each of said dielectric layers intermediate an associated pair of said plurality of metal layers;

a die cavity arranged for receiving said integrated circuit die;

a plurality of external pins arranged in a predetermined array;

a plurality of via electrical connections coupling selected ones of said metal patterns on selected ones of said metal layers through ones of said plurality of dielectric layers to associated ones of said plurality of external pins;

a plurality of connector tabs arranged as said predetermined metal patterns on a selected one of said plurality of metal layers and further established in offset rows adjacent said die cavity;

a plurality of wire bonds, each of said wire bonds coupled intermediate an associated one of said plurality of connector tabs and its associated one of said die pads.

16. A high density integrated circuit package as in claim 14 including;

a first set of said connector tabs in a first of said offset rows is arranged to be coupled to associated ones of a first set of said die pads;

a second set of said connector tabs in a second of said offset rows is arranged to be coupled to associated ones of a second set of said die pads; and a third set of said connector tabs in a third of said offset rows is arranged to be coupled to associated ones of a third set of said die pads.

16. A high density integrated circuit package as in claim 15, wherein said first set, said second set, and said third set of said connector tabs each have a predetermined tab pitch approximately three times said predetermined die pad pitch.

17. A high density integrated circuit package as in claim 16, wherein predetermined ones of said plurality of wire bonds are arranged in groups and are substantially parallel within said groups.

* * * * *